United States Patent
Jara

(10) Patent No.: US 10,114,095 B2
(45) Date of Patent: Oct. 30, 2018

(54) MULTI-SPECTRAL MRI SCAN WITH MAGNETIZATION RECOVERY

(71) Applicant: BOSTON MEDICAL CENTER CORPORATION, Boston, MA (US)

(72) Inventor: Hernan Jara, Belmont, MA (US)

(73) Assignee: BOSTON MEDICAL CENTER CORPORATION, Boston, MA (US)

( * ) Notice: Subject to any disclaimer, the term of this patent is extended or adjusted under 35 U.S.C. 154(b) by 432 days.

(21) Appl. No.: 14/913,988

(22) PCT Filed: Aug. 26, 2014

(86) PCT No.: PCT/US2014/052784
§ 371 (c)(1),
(2) Date: Feb. 23, 2016

(87) PCT Pub. No.: WO2015/031408
PCT Pub. Date: Mar. 5, 2015

(65) Prior Publication Data
US 2016/0291109 A1     Oct. 6, 2016

Related U.S. Application Data

(60) Provisional application No. 61/870,447, filed on Aug. 27, 2013.

(51) Int. Cl.
| G01V 3/00 | (2006.01) |
| G01R 33/483 | (2006.01) |
| G01R 33/50 | (2006.01) |
| G01R 33/561 | (2006.01) |

(52) U.S. Cl.
CPC ......... *G01R 33/4835* (2013.01); *G01R 33/50* (2013.01); *G01R 33/5617* (2013.01)

(58) Field of Classification Search
CPC ................................ G01R 33/4835
USPC ........................................ 324/309
See application file for complete search history.

(56) References Cited

U.S. PATENT DOCUMENTS

| 4,982,160 A * | 1/1991 | Hagiwara ............ G01R 33/482 324/307 |
| 5,751,145 A | 5/1998 | Shimizu |
| 5,755,665 A * | 5/1998 | Takahashi .......... G01R 33/4835 324/309 |
| 6,219,571 B1 | 4/2001 | Hargreaves |
| 8,405,395 B2 | 3/2013 | Setsompop |

* cited by examiner

*Primary Examiner* — Susan Lee
(74) *Attorney, Agent, or Firm* — Arrigo, Lee, Guttman & Mouta-Bellum LLP

(57) ABSTRACT

Methods, and systems and apparatus for implementing the methods, are described for performing efficient multispectral magnetic resonance imaging, such that images of multiple contrast weightings for each slice are acquired in a single scan. Such differentially weighted MR images are thus suitable for generating a plurality of coregistered parameter maps for each slice. The methods may comprise applying a first excitation pulse to a first slice of a subject; detecting a first plurality of echo signals emitted by the first slice after the first excitation pulse; waiting a first period of time; applying a second excitation pulse to the first slice during partial recovery of a longitudinal magnetization of the first slice; and detecting a second plurality of echo signals emitted by the first slice after the second excitation pulse.

20 Claims, 10 Drawing Sheets

580 582 584 586

590 592 594 596

MULTI-SPECTRAL MRI SCAN WITH MAGNETIZATION RECOVERY

This application claims priority to U.S. Provisional Patent Application No. 61/870,447, filed Aug. 27, 2013, the entire contents of which are hereby incorporated herein by reference.

INTRODUCTION

The present application generally concerns scanning methods for acquiring a plurality of magnetic resonance (MR) images with different MR contrast weightings in a single magnetic resonance imaging scan, as well as a magnetic resonance scanner with which such methods may be implemented.

MRI Imaging

Magnetic Resonance Imaging (MRI) is a known yet evolving medical technology with which images that depict the internal anatomy of an examination subject are generated. The examination subject is first immersed in a main magnetic field $B_0$ that exists in the bore of the MRI scanner for the purpose of magnetically polarizing the hydrogen protons (1H-protons) of all organs and tissues. Such magnetic polarization is known as the net longitudinal magnetization $M_0$. It is proportional to the proton density (PD) of the tissue and develops exponentially in time with a time constant known as the longitudinal relaxation time T1 of the tissue, also known as the spin-lattice relaxation time. The specific T1 values of individual tissues depend on their microscopic structure, on the water and/or lipid content, and the strength of the polarizing magnetic field. For these reasons, the T1 of a given tissue is also dependent on age and state of health.

In a second step conducive to generating MR imaging data, a time varying oscillatory magnetic field $B_1$, i.e. an excitation pulse, is applied to the magnetically polarized examination subject with a radiofrequency (RF) coil. The carrier frequency of the pulsed $B_1$ field is set to the resonance frequency of the 1H-proton, which causes the longitudinal magnetization to flip away from its equilibrium longitudinal direction. The net result is a rotated magnetization vector, which in general can have transverse as well as longitudinal magnetization components, depending on the flip angle used. The most common $B_1$ pulses are an inversion pulse, or a 180-degree pulse, and a 90-degree pulse. The 90-degree pulse rotates the 1H-proton's magnetization by 90 degrees so that the magnetization is in the transverse plane. The 180-degree pulse reverses the direction of the 1H-proton's magnetization in the longitudinal axis. The MR signals are proportional to the transverse components of the magnetization and are time varying electrical currents that are detected with suitable RF coils. These MR signals decay exponentially in time with a time constant known as the transverse relaxation time T2, which is also dependent on the microscopic tissue structure, water/lipid content, and the strength of the magnetic field used.

In a third step conducive to generating MR imaging data, the MR signals are spatially encoded by exposing the examination subject to three additional magnetic fields which are known as the gradient fields. These gradient fields, which vary linearly in space, are applied for short periods of time in pulsed form and with spatial variations along each of the three spatial directions. The net result is the generation of a plurality of spatially encoded MR signals, which can be reconstructed to form MR images depicting slices of the examination subject. The slices may be oriented in the transverse, sagittal, coronal, or any oblique plane.

In a final step, the spatially encoded signals of each slice of the scanned region are digitized and spatially decoded mathematically with a computer reconstruction program in order to generate images depicting the internal anatomy of the examination subject. The most widely used reconstruction program is based on the (inverse) Fourier transform, which back-transforms the spatially encoded data (k-space data) into geometrically decoded data (x-data).

MRI Pulse Sequences

In total, the application of the $B_1$ pulses and the encoding gradient pulses to a $B_0$-magnetized examination subject leads to the concept of an MRI pulse sequence. MRI pulse sequences are specified by a timing diagram, which is a blueprint of all pulses and their timing intervals, as these are played out by a MR scanner as a function of time during one cycle of the pulse sequence. The duration of each pulse sequence cycle is known as the repetition time TR and the time of signal measurement is known as the time of echo TE.

The resulting image intensities of individual tissues and organs in an MR image depend on the numerical values of the pulse sequence control variables used for the scan. Of particular importance are the values of TR and TE, which are commonly used to control the levels of T1- and T2-weightings respectively. Other pulse sequence control variables exist to control weightings to other tissue properties, such as the reduced transverse decay T2*, the apparent diffusion coefficient ADC, perfusion fraction, and several others.

There are infinite possible combinations of $B_1$ and gradient pulses leading to an equally infinite number of MRI pulse sequences. From simple to increasingly sophisticated, MRI pulse sequences can be classified according to the number of $B_1$ pulses used, starting from the gradient echo pulse sequences, which employ only one $B_1$ pulse TR cycle, to the spin-echo pulse sequence with two $B_1$ pulses, to more involved pulse sequences with a larger number of $B_1$ pulses.

Additionally, pulse sequences are also classified by the number of k-lines of each slice that are acquired per TR cycle. A k-line represents a measurement over k-space, differentiated by different phase encoding gradients. Conventional pulse sequences (e.g. gradient echo, spin echo, and multi spin echo) acquire one k-line per slice per TR cycle, while hybrid pulse sequences acquire multiple k-lines per TR cycle using a multi k-line readout that acquires a train of differently encoded k-lines. This leads to the concept of hybrid readout characterized by an echo train length (ETL), a phase encoding profile order, and an effective echo time (TEeff). Examples of widely used hybrid pulse sequences include the hybrid-RARE (fast spin echo (FSE) or turbo spin echo (TSE)), the gradient and spin echo (GraSE), and the echo planar imaging (EPI) pulse sequence, which acquires all k-lines in the form of a long train of gradient echoes. Furthermore, the hybrid-RARE (FSE or TSE) can be implemented as a dual echo pulse sequence, whereby the train of spin echoes is divided in two sub-trains for the purpose of generating two differently weighted images, typically a proton density weighted and a T2-weighted image. These two hybrid-RARE readouts can be implemented with different phase encoding profile orders. One such pulse in the prior art, a single $B_1$ excitation pulse followed by a dual turbo spin echo readout, is illustrated in FIG. 1.

qMRI Pulse Sequences

There is increasing interest and clinical need for developing MRI pulse sequences that can generate several images of the same slice with different MR contrasts in a single scan. The main advantage of such MRI pulse sequences is that the differently weighted images are spatially co-registered with each other at acquisition and also are acquired with identical receiver settings and other experimental settings. Hence these images can be processed to generate high quality quantitative maps of the MR parameters, such as the relaxation times (T1, T2, and T2*), the diffusion coefficient, and others parameters. For this reason, these multi contrast sequences are often referred to as quantitative MRI (qMRI) pulse sequences and the initially generated images are referred to as directly acquired (DA) images to distinguish these from the post processed qMRI maps. qMRI pulse sequences that generate DA images suitable for post-processing a plurality of MR parameters in single scan are referred to as multispectral. For example, a pulse sequence suitable for mapping simultaneously PD, T1, and T2 would be threefold multispectral.

Additionally, there is an increasing need to increase the scanning efficiency, anatomical coverage, spatial resolution, and speed of such multispectral qMRI pulse sequences in order to reduce the total patient examination time. This calls for efficient and multispectral fast qMRI pulse sequences that employ hybrid readouts, and/or parallel imaging, and or partial Fourier imaging techniques such as profile sharing. A further requirement of the needed multispectral qMRI pulse sequences is that the DA images are suitable for mapping a plurality of MR parameters accurately over their wide biological ranges.

qMRI Algorithms

The final output of a qMRI scan are the so-called qMRI maps—a.k.a. parameter maps—that portray the spatial distributions of the desired qMRI parameters (PD, relaxation times (T1, T2, T2*, etc.) on a pixel-by-pixel basis. Such qMRI algorithms are based on the mathematical solutions of the Bloch equations adapted to describe the specific qMRI pulse sequence used for image acquisition. The quality and accuracy of the generated qMRI maps depend on the image quality of the directly acquired (DA) images and on the fidelity of the physics model of the pulse sequence.

SUMMARY

It is an object of the present application to provide methods and an apparatus for generating a plurality of differently weighted MR images in a more efficient manner that has been previously described.

The object above is achieved in the present invention with methods, systems, and apparatus for acquiring magnetic resonance data wherein an anatomical region of an examination subject, termed the imaging volume, is exposed to a magnetic resonance pulse sequence that acquires a plurality of differently weighted MR signals in each TR cycle. The magnetic resonance pulse sequence that is employed includes a plurality of excitation pulses with approximate 90° flip angles each followed by a plurality of hybrid readouts (FSE, TSE, GraSE) leading to the acquisition of a plurality of MR signals with varying levels of weightings to a plurality of MR parameters.

Systems and methods are disclosed for conducting improved magnetic resonance imaging. In one aspect, systems and methods are provided that acquire multiple magnetic resonance images in a single pulse sequence, thus potentially reducing the amount of time a patient remains in an MRI machine while providing improved image quality. In certain implementations the resolution and quality of the images are improved for tissues that have unhealthy pathology, e.g. cancers, abnormal vascularization, excess swelling. A subject is placed in an MRI machine, which applies a longitudinal external magnetic field to the subject's body and a pulse sequence is applied. In one implementation, the pulse sequence starts with an RF excitation pulse that is applied to the slice when the longitudinal magnetization is maximally aligned with the external magnetic field. In such implementations, an inversion pulse may be avoided. The excitation pulse, which may be a 90-degree excitation pulse, tilts the magnetization of the slice into the transverse plane. A plurality of echo signals, for example three or more echo signals, are detected from the slice after the excitation pulse. The detection of echo signals may be accomplished via a number of methods, for example through a FSE (TSE) readout method as described above. After the echo signals are detected, the slice is allowed to recover during a recovery period, which is sufficient to allow the slice to partially and most importantly differentially recover along the longitudinal axis with the longitudinal external magnetic field. A second RF excitation pulse is applied to the slice and another plurality of echo signals is detected. A recovery period then occurs that is ideally sufficient for total recovery of the longitudinal magnetization along the z-axis. The period of time beginning at the first RF excitation pulse until the end of the second recovery time is termed the repetition time. A pulse sequence occurring during that period includes at least two excitation pulses, separated by the first recovery period. The pulse sequence may be interleaved to interrogate multiple slices during the first and second recovery periods. This pulse sequence may be repeated a predetermined number of times on the same slice to increase the signal-to-noise ratio of the data. The parameters T1, T2, T2*, proton density, and diffusion coefficient may each be determined using the data acquired from the above described pulse sequence. In certain implementations, all, or one or any combination of two or more of these parameters are determined using the pulse sequence and detected signals provided herein, i.e. the pulse sequence is multispectral.

In another aspect are provided for applying magnetic resonance scans on a subject. The method includes applying a first excitation pulse to a first slice of the subject, and detecting a first plurality of echo signals emitted by the first slice after the first excitation pulse. The systems and methods further include configurations for waiting a first period of time, applying a second excitation pulse to the first slice during partial recovery of the longitudinal magnetization, and detecting a second plurality of echo signals emitted by the first slice after the second excitation pulse.

Detecting the first plurality of echo signals may include obtaining an electrical response from each echo signal in the first plurality of echo signals. The detected first plurality of echo signals may be spin echoes, gradient echoes, or a combination of spin echoes and gradient echoes. A first echo signal in the first plurality of echo signals and a first echo signal in the second plurality of echo signals may be combined to form a plurality of fast spin echo readouts, a plurality of turbo spin echo readouts, or a plurality of gradient and spin echo readouts. The first excitation pulse and subsequent readouts may be applied to other slices of the subject during the first period of time.

The method may further include waiting a second period of time after the second plurality of echo signals are detected repeating all steps a predetermined number of times. The second excitation pulse and subsequent readouts may be applied to other slices of the subject during the second period of time. The method may also include storing data indicative of a plurality of parameters of the first slice from the detected first plurality of echo signals and the second plurality of echo signals over the predetermined number of times. The data may be stored in computer memory. The Fourier transform can be applied to the data to form a plurality of differently weighted magnetic resonance images for the first slice. A plurality of magnetic resonance images are constructed from the data. The first excitation pulse is applied when the longitudinal magnetization of the first slice is aligned with an externally applied magnetic field.

Another aspect described herein discloses a method for performing magnetic resonance scans on a subject. The method includes applying a first excitation pulse to a first slice of the subject, detecting a first set of at least three echo signals emitted by the first slice after the first excitation pulse, waiting a first period of time, and repeating the above steps a first predetermined number of times. The method further includes applying a second excitation pulse to the first slice, detecting a second set of at least three echo signals emitted by the first slice after the second excitation pulse, waiting a second period of time, and repeating the above steps a second predetermined number of times.

Detecting the first plurality of echo signals may include obtaining an electrical response from each echo signal in the first plurality of echo signals. The detected first plurality of echo signals may be spin echoes, gradient echoes, or a combination of spin echoes and gradient echoes. A first echo signal in the first plurality of echo signals and a first echo signal in the second plurality of echo signals may be combined to form a plurality of fast spin echo readouts, a plurality of turbo spin echo readouts, or a plurality of gradient and spin echo readouts. The first excitation pulse and subsequent readouts may be applied to other slices of the subject during the first period of time. The second excitation pulse and subsequent readouts may be applied to other slices of the subject during the second period of time.

The method may also include storing data indicative of a plurality of parameters of the first slice from the detected first plurality of echo signals and the second plurality of echo signals over the predetermined number of times. The data may be stored in computer memory. The Fourier transform can be applied to the data to form a plurality of differently weighted magnetic resonance images for the first slice. A plurality of magnetic resonance images are constructed from the data. The first excitation pulse is applied when the longitudinal magnetization of the first slice is aligned with an externally applied magnetic field.

Another aspect described herein discloses a system configured for performing magnetic resonance imaging. The system includes a magnetic resonance imaging machine configured to apply an external magnetic field and a plurality of excitation pulses to a subject in the magnetic resonance imaging machine, and a control system connected to the magnetic resonance imaging machine and configured to perform any of the methods discussed above and/or disclosed herein.

Another aspect described herein discloses a means for performing a multi-slice magnetic resonance scan on a subject. The means include means for applying a first excitation pulse to a slice of a subject, means for applying a second excitation pulse to the slice after partial recovery of the longitudinal magnetizations of the tissues in the slice, and means for detecting a plurality of echo signals emitted by the slice after each of the first excitation pulse and the second excitation pulse.

BRIEF DESCRIPTION OF THE DRAWINGS

The methods and systems may be better understood from the following illustrative description with reference to the following drawings in which.

DETAILED DESCRIPTION

To provide an overall understanding of the systems and methods described herein, certain illustrative embodiments will now be described. However, it will be understood that the systems and methods described herein may be adapted and modified as is appropriate for the application being addressed and that the systems and methods described herein may be employed in other suitable applications, and that such other additions and modifications will not depart from the scope thereof. In particular, a computerized control system, computer, processor, or server as used in this description may be a single computing device or multiple computing devices working collectively and in which the storage of data and the execution of functions are spread out amongst the various computing devices.

Aspects of the systems and methods described herein relate to a pulse sequence with magnetization recovery and the use of such pulse sequence to obtain magnetic resonance images of a subject. The magnetic resonance images may be multispectral—that is, more than one magnetic resonance image parameter may be obtained from a single pulse sequence. One or more of the parameters are used to generate the magnetic resonance images. Such parameters include any of the spin-lattice relaxation time T1, the spin-spin relaxation time T2, the spin-spin relaxation time with local in-homogeneities T2*, the proton density, and diffusion coefficient.

Figure 1:
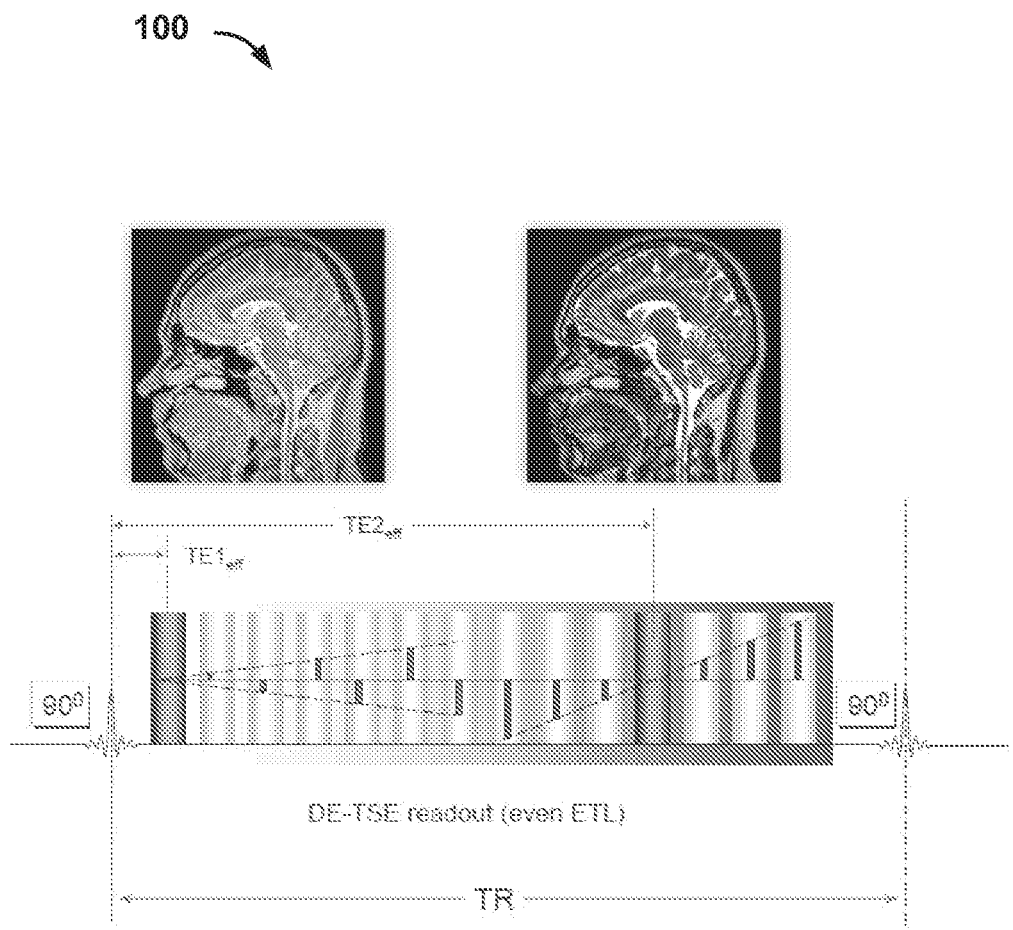
FIG. 1 shows a schematic diagram of a prior art pulse sequence timing diagram with a single excitation and dual turbo spin echo readouts.
Figure 2:
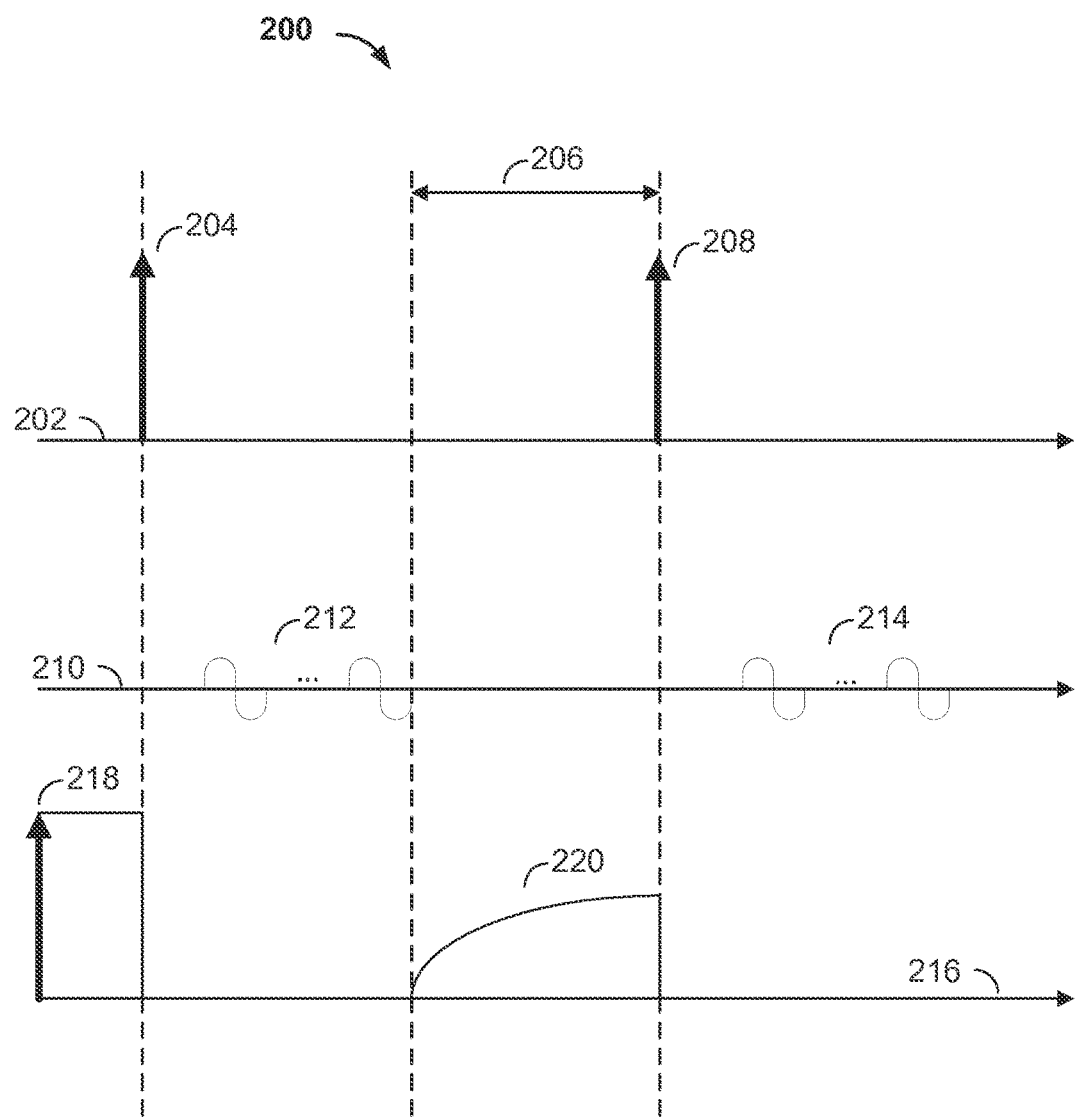
FIG. 2 shows a magnetic resonance pulse sequence timing diagram with partial magnetization recovery in accordance with an implementation as described herein.

FIG. 2 illustrates a pulse sequence timing diagram 200 for a pulse sequence with partial magnetization recovery. The pulse sequence illustrated in FIG. 2 is applied to a slice, or a volume of interest, of an examination subject placed inside an MRI machine. When the subject is placed in an MRI scanner, the main magnetic field magnetizes the subject. This longitudinal external magnetic field is denoted $B_0$, and can be on the order of 1.5 Tesla (T), 3 T, 4.7 T, 7 T, or any other achievable and/or desired magnetic field strength. Pulsed RF fields and gradient magnetic fields are then applied to the subject in the form of an imaging pulse sequence, where the gradient magnetic fields linearly vary along a particular axis with respect to the subject (e.g. z-axis, y-axis, and x-axis). FIG. 2 includes a pulse sequence time axis 202, which shows RF excitation pulses applied to a slice of the subject, an echo signal time axis 210, and a longitudinal magnetization time axis 216. Each time axis increasing in time from left to right. The echo signal time axis 210 shows echo signals emitted by the slice after the application of the RF excitation pulses. The longitudinal magnetization time axis 216 shows the longitudinal magnetization strength of the slice over time. The vertical axis of each time axis represents a magnetization magnitude, such as magnitude of an excitation pulse on pulse sequence time axis 202, magnitude of an echo signal on echo signal time axis 210, and magnitude of longitudinal magnetization of the slice on longitudinal magnetization time axis 216.

When in the continued presence of the external magnetic field $B_0$, the protons in the hydrogen atoms of the subject's body, including the protons in the slice to be interrogated, align maximally with the external magnetic field. During maximum positive alignment, a point is reached where a majority of the protons are aligned positively with $B_0$ while a minority of protons are aligned negatively (i.e. in the opposite direction of) with $B_0$. The longitudinal magnetization of the slice when maximally positively aligned with $B_0$ is the net longitudinal magnetization $M_0$. The relative magnitude of net magnetization $M_0$ is shown by arrow 218 in FIG. 2. While the slice is at $M_0$, a first RF excitation pulse 204 is applied to the slice. Excitation pulse 204 has the same resonant frequency as the protons in the slice and thus causes the protons to resonate. Excitation pulse 204 may be a 90-degree pulse that causes the magnetic moment of the protons in the slice to tilt into the transverse plane. Alternatively, excitation pulse 204 may also cause the magnetic moment to tilt by other angles from the longitudinal plane, such as by 45 degrees or 60 degrees. With a 90-degree excitation pulse, the longitudinal magnetization of the slice drops to zero as shown on longitudinal magnetization time axis 216. After excitation pulse 204 is applied, a plurality of echo signals 212 are emitted by the slice and detected by a receiving coil in the MRI machine. Echo signals may be generated by using 180 degree refocusing pulses. There are a number of known methods to generate and read out spin echo signals from a slice, such as a fast spin-echo or turbo spin-echo readout (FSE or TSE), a gradient and spin echo readout (GRASE), and an echo planar readout (EPI). For example, a fast echo spin readout is described in U.S. Pat. No. 4,521,733, entitled "NMR Imaging of the Transverse Relaxation Time Using Multiple Spin Echo Sequences," which is hereby incorporated by reference in its entirety.

More than one echo signal is generated and detected after excitation pulse 204. The data acquired from each of the multiple echo signals after a single excitation pulse may be used to obtain one or more magnetic resonance imaging parameters, such as spin-spin relaxation time T2 or T2* or other parameters identified above. The number of echo signals detected is greater than one and up to a predetermined number of spin echoes. For example, the pulse sequence may be designed to detect three echo signals using an FSE readout technique.

After the predetermined number of echo signals 212 are detected, a first recovery period 206 is allowed before application of another RF excitation pulse 208. This recovery period 206 allows the longitudinal magnetization of the slice to partially and differentially recover as shown as curve 220. When no pulses are present, the magnetic moments of the protons in the slice begin to realign with the longitudinal external magnetic field $B_0$ of the MRI machine. Curve 220 shows the magnitude of the longitudinal magnetization during recovery period 206. Curve 120 starts at zero and approaches net magnetization 218 over time, but the second excitation pulse 208 preferably occurs before the slice fully recovers to net magnetization 218. The second excitation pulse 208 realigns the magnetic moment of the slice away from the external magnetic field $B_0$ of the MRI machine. For example, the second excitation pulse 208 is a 90-degree pulse that tilts the magnetic moment of the slice back into the transverse plane, or may be another pulse as desired such as a 45-degree pulse or a 60-degree pulse. Thus, the longitudinal magnetization of the slice is driven back to zero, shown on longitudinal magnetization time axis 216. After the second excitation pulse 208 is applied, a further plurality of echo signals 214 is generated and detected from the slice using any one of the methods previously discussed. The readout methods used to detect the second plurality of echo signals 214 may or may not be the same readout methods used to detect the first plurality of echo signals 212. The number of echo signals detected after the second excitation pulse 208 is greater than one and up to a predetermined number of spin echoes, which may be equal or different from the number of echo signals detected after the first excitation pulse 204. In certain embodiments, this pulse sequence with two excitation pulses, the detection of a plurality of echo signals after each excitation pulse, full positive alignment with $B_0$ before the first excitation pulse, and partial recovery of longitudinal magnetization before the second excitation pulse provides the data to generate multiple magnetic resonance imaging parameters, such as one or more of T1, T2, T2*, proton density, and diffusion coefficient. The generation of magnetic resonance imaging parameters is further discussed in relation to FIG. 5.

Figure 3:
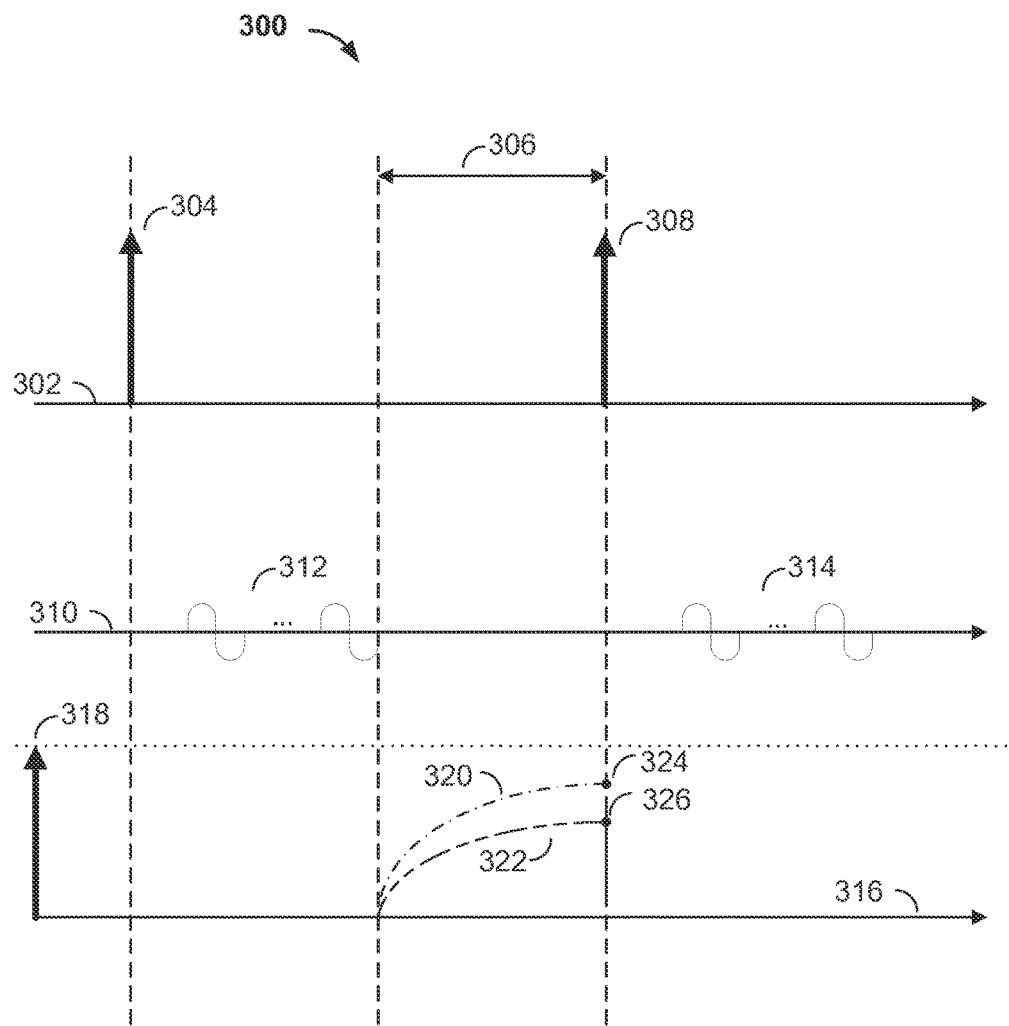
FIG. 3 illustrates longitudinal magnetization recoveries for tissues during a magnetic resonance pulse sequence in accordance with an implementation as described herein.

The partial recovery of the longitudinal magnetization of a slice between the first and second excitation pulses is discussed in further detail in FIG. 3. Pulse sequence timing diagram 300 shows the same pulse sequence illustrated in FIG. 2 with respect to a slice. FIG. 3 includes a pulse sequence time axis 302, an echo signal time axis 310, and a longitudinal magnetization time axis 316, each time axis increasing in time from left to right. The vertical axis of each time axis represents a magnetization magnitude of the excitation pulses, echo signals, and longitudinal magnetization of the slice respectively. Two excitation pulses 304 and 308 are shown, and after each excitation pulse, a plurality of echo signals are detected from the slice, shown as first plurality 312 and second plurality 314 respectively. Arrow 318 represents the net longitudinal magnetization $M_0$ of the slice in the presence of an external magnetic field $B_0$ applied by the MRI machine to the slice. After detection of the last echo signal in the first plurality of echo signals 312, the longitudinal magnetization of the slice is zero. A recovery period 306 is imposed on the slice between the end of the detection of the last echo signal in the first plurality of echo signals 312 and the application of the second excitation pulse 308. During this recovery period the longitudinal magnetization of the slice starts to realign with external magnetic field $B_0$. The slice does not completely realign back to its net magnetization 318 before the application of the second excitation pulse 308, and so the slice only partially recovers its original longitudinal magnetization.

Each slice of a subject includes bodily tissue of one or more different types, such as fat, bone, blood, skin, muscle, tendon, various organs, and other tissues. In the brain, the tissues may also include cerebrospinal fluid (CSF), gray matter, white matter, and other brain-specific tissue. Each tissue has a characteristic T1 relaxation time, a measure of the time to recover its longitudinal magnetization after being disturbed by an excitation pulse such as RF pulse 304. Thus, during recovery period 306 the different tissue types within the slice recover their longitudinal magnetization at different rates. At the end of recovery period 306, just before the second excitation pulse 308 is applied to the slice, each tissue type has a different longitudinal magnetization. For example, curve 320 shows the longitudinal magnetization of a first tissue type in the slice, such as fat. Curve 322 shows the longitudinal magnetization of a second tissue type in the slice, such as cranial spinal fluid. Fat has a shorter T1 relaxation time than CSF, so at the end of recovery period 306 the longitudinal magnetization of fat 324 is greater than the longitudinal magnetization of cranial spinal fluid 326. As illustrated, curve 320 has a greater value of longitudinal magnetization than curve 322 at the end of recovery period 306. Other tissue types in the slice may have other T1 relaxation curves, not illustrated in FIG. 3. By allowing the different tissue types to partially recover at different rates before the second excitation pulse, a magnetic resonance image showing strong T1 contrasts may be generated, which is discussed later.

Figure 4:
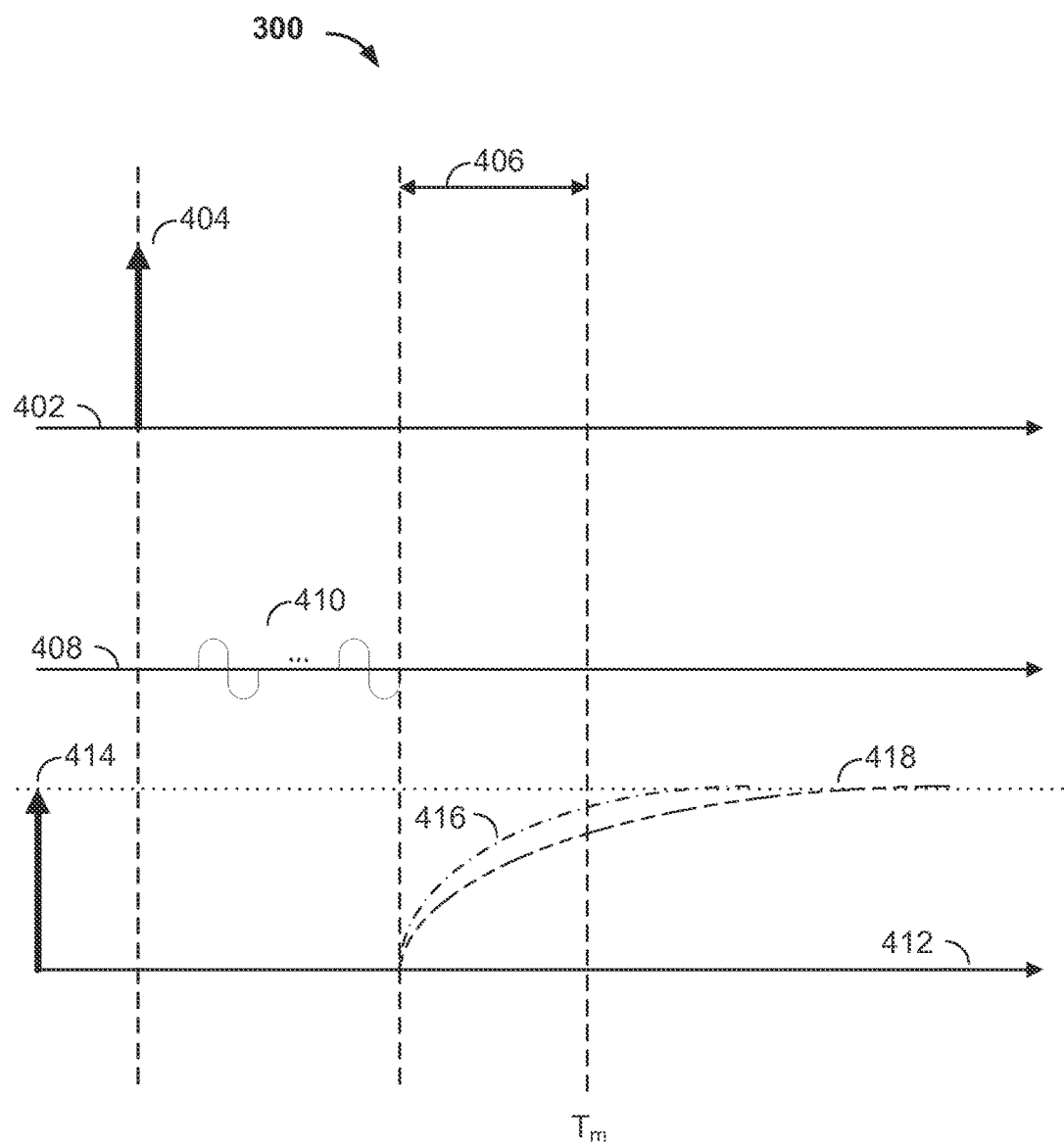
FIG. 4 illustrates longitudinal magnetization recoveries for tissues during a magnetic resonance pulse sequence in accordance with an implementation as described herein.

In order to create a good quality T1 map, the spread of T1 partial relaxation times should be maximized. This can be done by setting the length of the recovery period so that the difference between the longitudinal magnetizations of the different tissue types is at a net magnetization $M_0$ at the end of the recovery period. FIG. 4 shows an example of extending the first recovery period to maximize the difference of recovery times during the recovery period. Pulse sequence timing diagram 400 in FIG. 4 includes a pulse sequence time axis 402, an echo signal time axis 408, and a longitudinal magnetization time axis 412, each time axis increasing in time from left to right. The vertical axis of each time axis represents a magnetization magnitude of the excitation pulses, echo signals, and longitudinal magnetization of the slice respectively. Arrow 414 represents the net magnetization $M_0$ of the slice while exposed to an external magnetic field $B_0$ applied by the MRI machine to the slice. As in FIGS. 2 and 3, an excitation pulse 404 is applied to the slice while it is maximally magnetized in the longitudinal direction. After the excitation pulse 404 is applied a plurality of echo signals 410 are detected from the slice. After the last echo signal is detected, the longitudinal magnetization of the slice is zero and recovers during recovery period 406. Curve 416 shows the recovery curve for a first tissue type while curve 418 shows the recovery curve for a second tissue type.

The first tissue type has a shorter T1 relaxation time than the second tissue type and so the first tissue type will fully recover to the net magnetization 414 faster than the second tissue type. Thus curves 416 and 418 begin to diverge after recovery period 406 begins. At some later time, the first tissue will reach the net magnetization 414 and so curve 416 remains constant. Meanwhile, curve 418 is still recovering in the longitudinal direction: it converges again with curve 416 when the second tissue type maximally aligns with the external magnetic field $B_0$. In some embodiments, there is a point in time where curves 416 and 418 have a maximum difference of longitudinal magnetization before their values begin to converge again. In some embodiments, to obtain maximum T1 contrast, the second excitation pulse is applied when the difference between the longitudinal magnetizations of the first and second tissue type are at a maximum. Recovery period 406 is chosen to begin at a time TI1 that coincides with this maximum. If there are more than two tissue types in the slice, the second excitation pulse may be applied when the longitudinal magnetizations of the tissues with the fastest and slowest relaxation times are at a maximum, or when the longitudinal magnetizations of all the tissues are most evenly spread out, or some other metric.

Figure 5A:
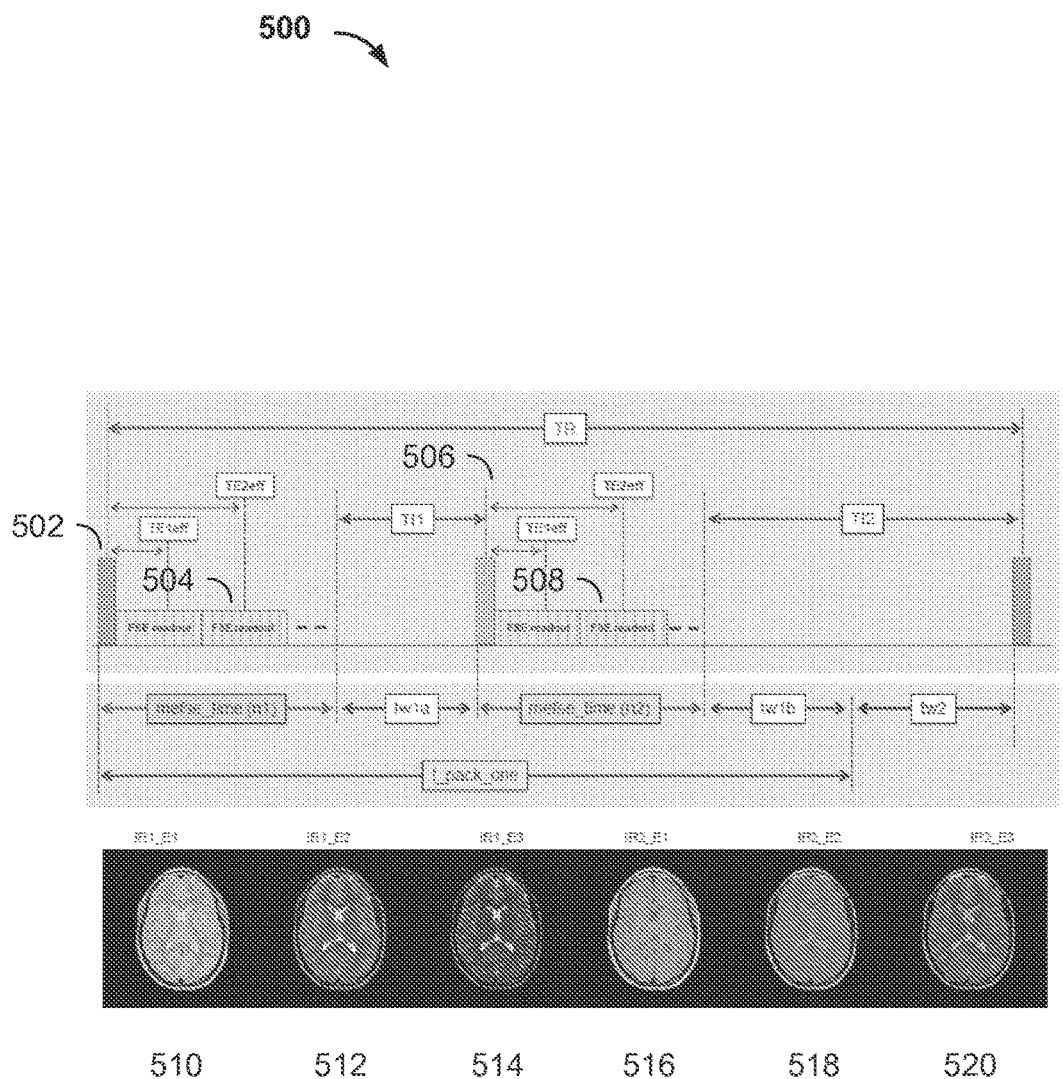
FIG. 5A shows a magnetic resonance pulse sequence timing diagram with partial magnetization recovery in accordance with an implementation as described herein.

The pulse sequence illustrated in FIG. 2 may be repeated a number of times on each slice of the subject to obtain imaging data. FIG. 5A shows a pulse sequence timing diagram adapted for repeated application to a slice of the subject over a repetition time TR. Pulse sequence diagram 500 shows a first excitation pulse 502 applied to a slice of a subject. The first excitation pulse 502 is preferably a 90-degree pulse but may take other configurations such as a 45-degree pulse or 60-degree pulse. The longitudinal magnetization of the slice is reduced to zero after the first excitation pulse 502. A plurality of echo signals 504 are detected from the slice using any known method such as fast spin echo readout. Each consecutive echo signal occurs at a time TE1$eff$, TE2$eff$, and so on. For example, there may be three echo signals detected after the first excitation pulse 502. After the detection of the last echo signal, the longitudinal magnetization of the slice is zero. The longitudinal magnetization undergoes a partial recovery during recovery time TI1. A second excitation pulse 506 is preferably applied at a moment during TR when the longitudinal magnetization of a first tissue type and a second tissue type is at a maximum. During recovery time TI1, the MRI machine may apply the first excitation pulse and subsequent readouts to one or more other slices of the subject, a method known as inter-leaving. Inter-leaving the scanning allows quicker total scan time by utilizing the otherwise idle recovery time TI1 to accomplish more data collection.

At the end of recovery time TI1, while the slice has partially recovered its longitudinal magnetization, a second excitation pulse 506 is applied to the slice. The second excitation pulse is preferably 90-degree pulse but may take other configurations such as a 45-degree pulse or 60-degree pulse. A plurality of echo signals 508 are detected from the slice using any known method such as fast spin echo readout. The readout methods used to detect the second plurality of echo signals 508 may not be the same readout methods used to detect the first plurality of echo signals 504. The number of echo signals 508 detected may be equal to or different from the number of echo signals 504 detected after the first excitation pulse 502. After the detection of the last echo signal, the longitudinal magnetization of the slice is again zero. Another recovery time TI2 is allowed after detection of the last echo signal, permitting the tissues of the slice to fully recover to its longitudinal magnetization equilibrium value. During recovery time TI2, the MRI machine may apply the second excitation pulse and subsequent readouts to one or more other slices of the subject (i.e. inter-leaving). At the end of total recovery time TI2, the pulse sequence may be repeated, i.e. the first excitation pulse 502 is again applied to the slice. The total time for one iteration of the pulse sequence is termed the repetition time TR. Repeating the pulse sequence allows for a greater signal-to-noise ratio in the data, which results in more clarity in the magnetic resonance images. Pulse sequence 500 may be repeated a predetermined number of times, until a predetermined amount of magnetic resonance data have been acquired. For example, the pulse sequence may be repeated with different spatial encodings until the data necessary to reconstruct a plurality of magnetic resonance images has been acquired.

In an alternative implementation of pulse sequence 500, the first excitation pulse 502, echo pulse readouts 504, and recovery time TI1 are repeated a predetermined number of times for each slice of the subject. Then, the second excitation pulse 506, echo pulse readouts 508, and recovery time TI2 are repeated a predetermined number of times for each slice of the subject. Each half of pulse sequence 500 is repeated sequentially, until a predetermined amount of magnetic resonance data has been acquired.

FIG. 5A also shows the multi-spectral nature of pulse sequence 500. A series of magnetic resonance images were generated from each echo signal, shown in FIG. 5A as images 510 through 520. These brain images where generated from PD, T1, and T2 qMRI maps used in conjunction to a synthetic MRI algorithm, which is a computer program that synthesizes images of arbitrary T1-and T2-weightings based on the mathematics of MRI physics as applicable to individual pulse sequence models. While FIG. 5A shows three images per set of echo signals, and thus three echo signals in each set, the number of images generated varies depending on how many echo signals are detected after each excitation pulse. Images 510 through 520 show the intensity of the transverse magnetization of the slice after the excitation pulse. As time progresses after an excitation pulse, the strength of the transverse magnetization of the slice fades. However, each tissue type has a different T2 relaxation time and thus some portions of the slice retain transverse magnetization longer than other tissue types. Thus, image 514 has overall less intensity than image 510, but the areas of image 514 that still have strong transverse magnetization represent tissue types with longer T2 relaxation times. Comparing images from the same set of echo signals, such as images 510 and 514, may be used to determine the T2 relaxation types for the different tissue types in the slice, which may allow for identification of the specific tissues types present. For example, pathological tissues may have longer T2 relaxation times than healthy tissues and so later echo signals, such as image 514, may reveal the presence of pathological tissue in the slice. T2* relaxation times may be acquired in a similar manner by utilizing gradient echo readouts to capture the de-phasing effects of local magnetization in-homogeneities.

Different tissue types have different T1 longitudinal magnetization relaxation times. T1 relaxation times may be calculated by comparing the intensity of images from different sets of echo signals. For example, image 510 from the first echo signal of the first set may be compared to image 516 from the first echo signal of the second set. The magnetization is maximally aligned with the external magnetic field when the first excitation pulse is applied, while the slice is only partially aligned with the external magnetic field when the second excitation pulse is applied. The excitation pulses tilt the longitudinal magnetization of the slice into the transverse plane, thus the magnitude of the transverse magnetization shortly after the excitation pulse reveals information about the magnitude of the longitudinal magnetization shortly before the excitation pulse. Different tissue types recover longitudinal magnetization at different rates, so comparing the transverse magnetization intensities of echo signals after the first excitation pulse (where the slice is at its net magnetization $M_0$) and the second excitation pulse (where the slice has partially recovered) may highlight the differences in T1 relaxation times between different tissue types. The proton density of the slice may be determined from the first echo signals in each set of echo signals because the magnetization intensity of all tissue types in the slice are greatest at the first echo signal (i.e. less time for the magnetization to decay). The diffusion coefficient for fluids such as water may be obtained by utilizing multiple gradient spin echo readouts and applying time correlation theory to the resultant echo signal magnetization intensities. Thus with a single pulse sequence the magnetic resonance imaging parameters, T1, T2, T2*, proton density, and diffusion coefficient may all be obtained. Other imaging parameters may also be obtained from the pulse sequence. The pulse sequence may be used in conjunction with various scanning and image acquisition techniques, such as multi-slice 2D mode, multi-slab 3D mode, full 3D mode, and parallel imaging techniques such as SENSE and ASSET.

Figure 5B:
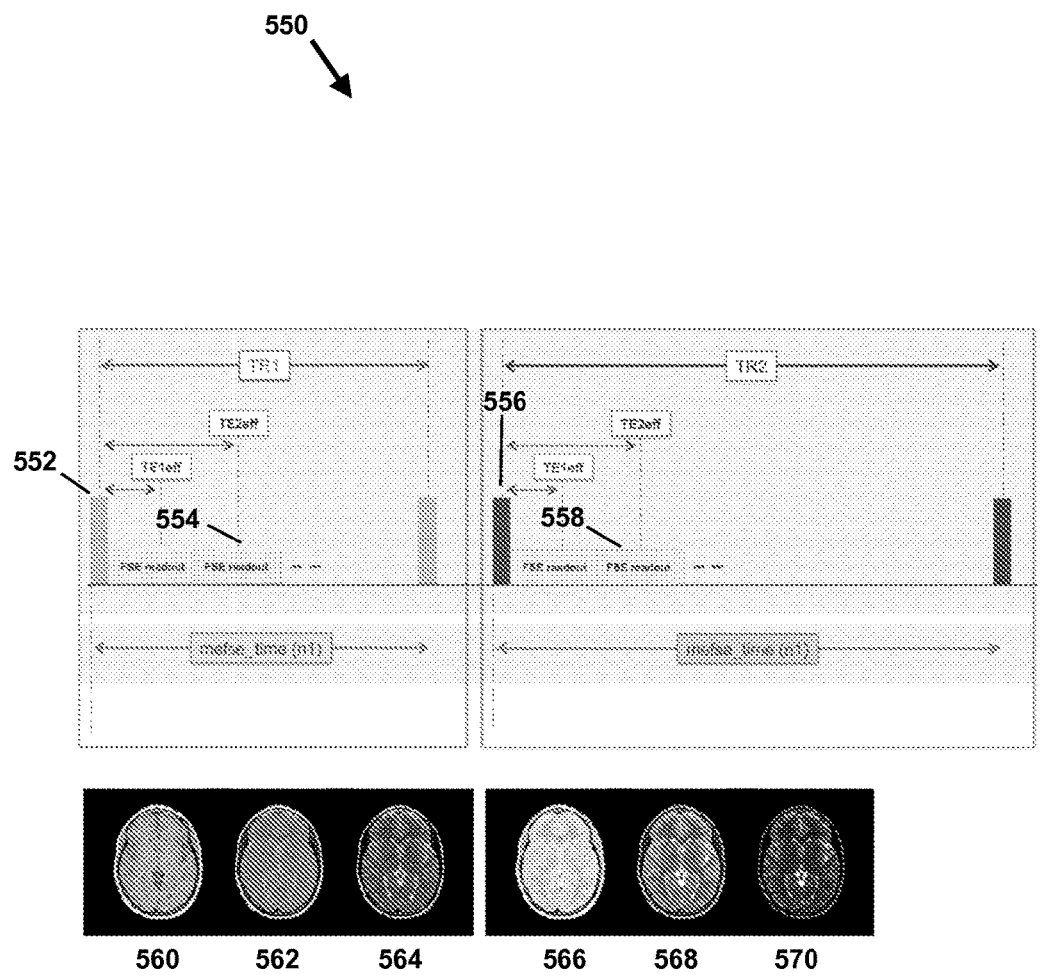
FIG. 5B shows a magnetic resonance pulse sequence timing diagram with partial magnetization recovery in accordance with an implementation as described herein.

FIG. 5B shows a pulse sequence timing diagram adapted for repeated application to a slice of the subject over a repetition time TR. Pulse sequence diagram 550 shows a first excitation pulse 552 applied to a slice of a subject. The first excitation pulse 552 is preferably a 90-degree pulse but may take other configurations such as a 45-degree pulse or 60-degree pulse. The longitudinal magnetization of the slice is reduced to zero after the first excitation pulse 552. A plurality of echo signals 554 are detected from the slice using any known method such as fast spin echo readout. Each consecutive echo signal occurs at a time TE1$e\!f\!f$, TE2$e\!f\!f$, and so on. For example, there may be three echo signals detected after the first excitation pulse 552. This sequence of excitation and readout pulses are repeated until all the imaging data in k-space necessary for reconstructing a plurality of images covering the entire imaging volume and with varying levels of T1- and T2-weightings are acquired. This initial section of the pulse sequence, which is acquired with a repetition time TR1 is followed immediately and without delay by an identical series of pulses (556-558), the only differences being the repetition time TR2 and the number of slices interrogated in each TR cycle. As such, FIG. 5B illustrates a concatenated variant of the original pulse sequence (FIG. 5A). The key feature of this pulse sequence is that TR1 should be different from TR2. In some implementations TR1 is shorter than TR2 and in some implementations TR2 is longer than TR1.

Figure 5C:
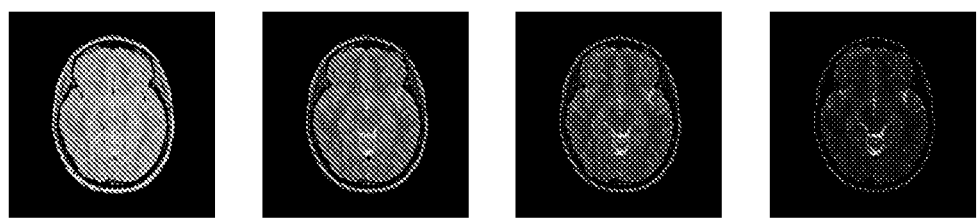
FIG. 5C shows a synthetic-MRI series generated using PD, T1, and T2 maps generated with simulated images from the ms_qMRI interleaved pulse sequence.
Figure 5C:
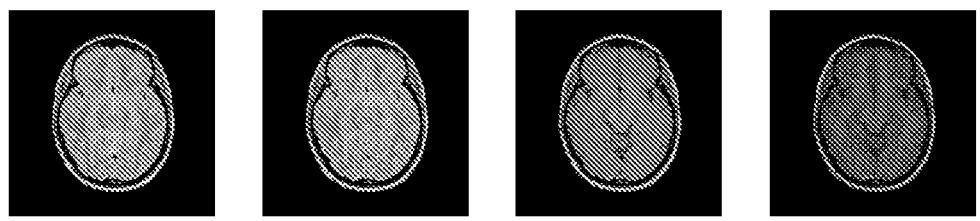

Illustrative examples of brain images obtainable with this concatenated pulse sequence variant are shown in the bottom row of FIG. 5B (560, 562, and 564) for the first concatenation acquired with repetition time TR1 and (566, 568, 570) for the second concatenation acquired with a repetition time TR2. These brain images where generated from PD, T1, and T2 qMRI maps used in conjunction to a synthetic MRI algorithm, which is a computer program that synthesizes images of arbitrary T1-and T2-weightings based on the mathematics of MRI physics as applicable to individual pulse sequence models. Examples of such synthesized images are shown in FIG. 5C in the form of a T2-weighted series (top row) and a T1-weighted series (bottom row). The T2-weighted series (580, 582, 584, and 586) was generated by varying the simulation TE time parameter in the range: 0 ms, 50 ms, 100 ms, and 200 ms respectively. The T1-weighted series (590, 592, 594, and 596) was generated by varying the simulated TR time in the range: 60,000 ms, 6,000 ms, 2,000 ms, and 1,000 ms, respectively.

Figure 6:
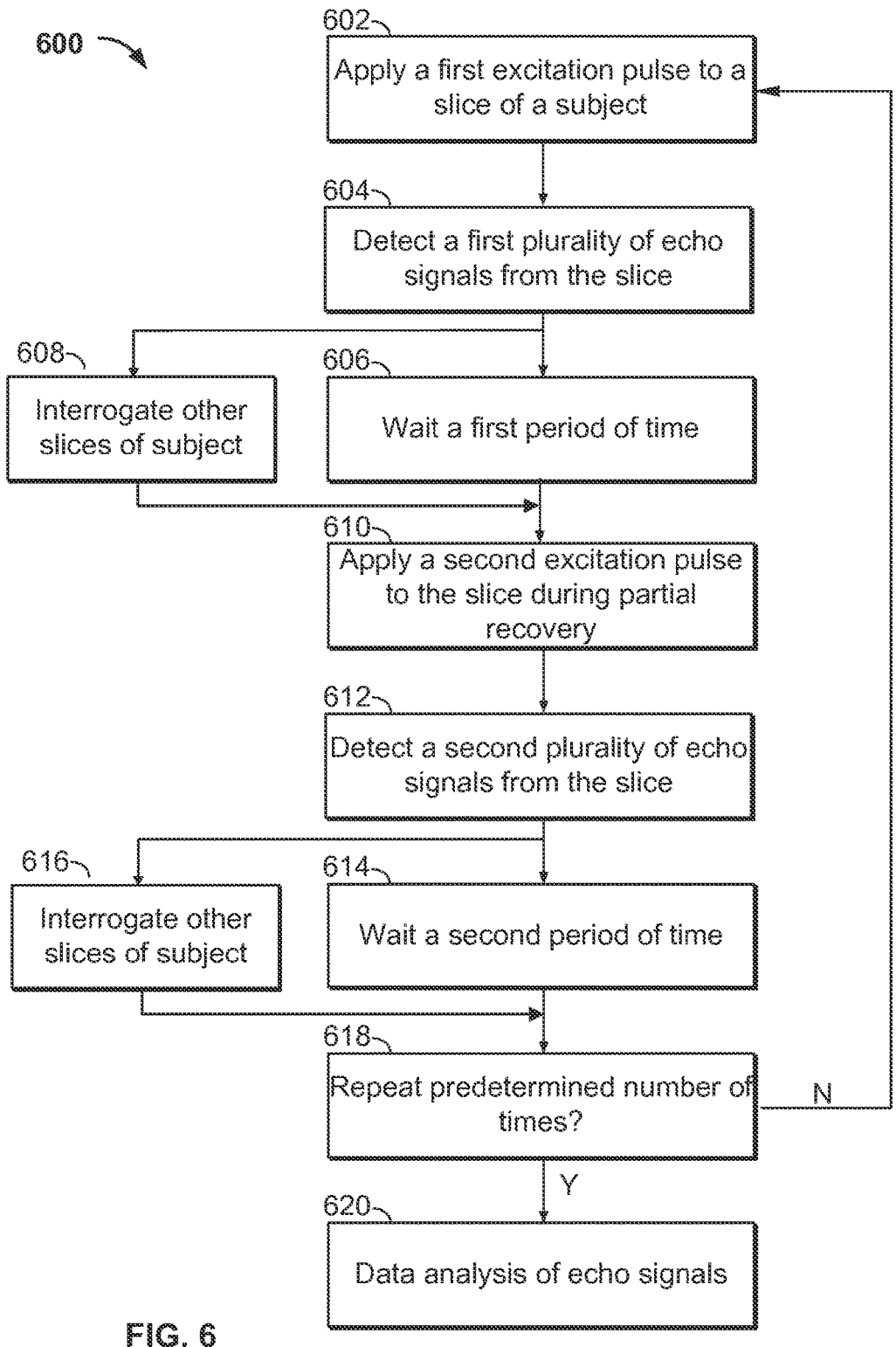
FIG. 6 shows a flow chart for a performing magnetic resonance pulse sequence with partial magnetization recovery in accordance with an implementation as described herein.

FIG. 6 shows a flow chart of a method 600 of applying the pulse sequence illustrated in FIG. 5. Method 600 is performed on a slice of a subject placed inside an MRI scanner, which exerts an external magnetic field and a gradient magnetic field on the subject. The segment of the subject's body to be scanned is divided into a number of slices, which may be consecutive cross-sectional portions. Method 600 begins by applying a first excitation pulse to a slice of a subject, shown at 602. The first excitation pulse is preferably 90-degree pulse but may take other configurations such as a 45-degree pulse or 60-degree pulse. The slice is originally maximally aligned with the external magnetic field and the first excitation pulse tilts the magnetization of the slice into the transverse plane. After the first excitation pulse is applied, a first plurality of echo signals is detected from the slice, shown at 604. Methods of generating and reading out echo signals may include, for example, a fast spin echo readout, a gradient and spin echo readout, or an echo planar readout. The number of echo spins generated is more than one and can be up to any predetermined number, such as three or four. At the end of the last echo signal readout, the longitudinal magnetization of the slice is zero.

Similar to the embodiments illustrated in FIGS. 2-5, after the echo signals are detected, the MRI scanner waits a first period of time, shown at 606. During this period of time, the longitudinal magnetization of the slice begins to recover from zero to its value before the first excitation pulse was applied, or in other words begins to positively align with the external magnetic field. The slice is only partially recovered when a second excitation pulse is applied, shown at 610. For example, the slice may be composed on several different tissue types, each of which has a different longitudinal magnetization recovery time. As discussed above, the duration of the first period of time and application of the second excitation pulse occurs when the spread between the longitudinal magnetizations of the tissues is at a maximum, or alternatively occurs at some other point during the partial recovery of the slice. During the first period of time, the MRI machine may inter-leave the scan, or interrogate other slices of the subject, shown at 608. For example, the MRI machine may apply the first excitation pulse and nearly simultaneously detect a plurality of echo signals from other slices.

The second excitation pulse applied at 610 and is preferably 90 degree pulse but may take other configurations such as a 45 degree pulse or 60 degree pulse. The pulse again tilts the magnetization of the slice into the transverse plane. After the second excitation pulse is applied, a second plurality of echo signals is detected from the slice, shown at 612. The number of echo signals detected after the second excitation pulse may or may not be the same as the number of echo signals detected after the first excitation pulse. The readout methods used to detect the second plurality of echo signals may not be the same readout methods used to detect the first plurality of echo signals. At the end of the last echo signal readout, the longitudinal magnetization of the slice is zero. The MRI machine waits a second period of time, shown at 614. During this period of time, the slice fully recovers and is maximally aligned with the external magnetic field exerted by the MRI machine. Also during the second period of time the MRI machine may interrogate other slices of the subject, shown at 616. That is, the MRI machine applies a second excitation pulse to partially recovered slices and read out a plurality of echo signals. The pulse sequence may then be repeated a predetermined number of times, shown at 618. The number of repetitions of the pulse sequence and the repetition time 612 may be chosen such that the total scan time of the subject is less than a target time, for example less than 10 minutes. Alternatively, the pulse sequence may be repeated until a predetermined amount of magnetic resonance data has been acquired. After the repetition of the pulse sequence is complete, data analysis on the readouts of the echo signals may then be performed, shown at 620. The pulse sequence illustrated in method 600 may be described as multi-spectral, meaning that multiple magnetic resonance image parameters may be obtained using the data acquired during the pulse sequence.

Figure 7:
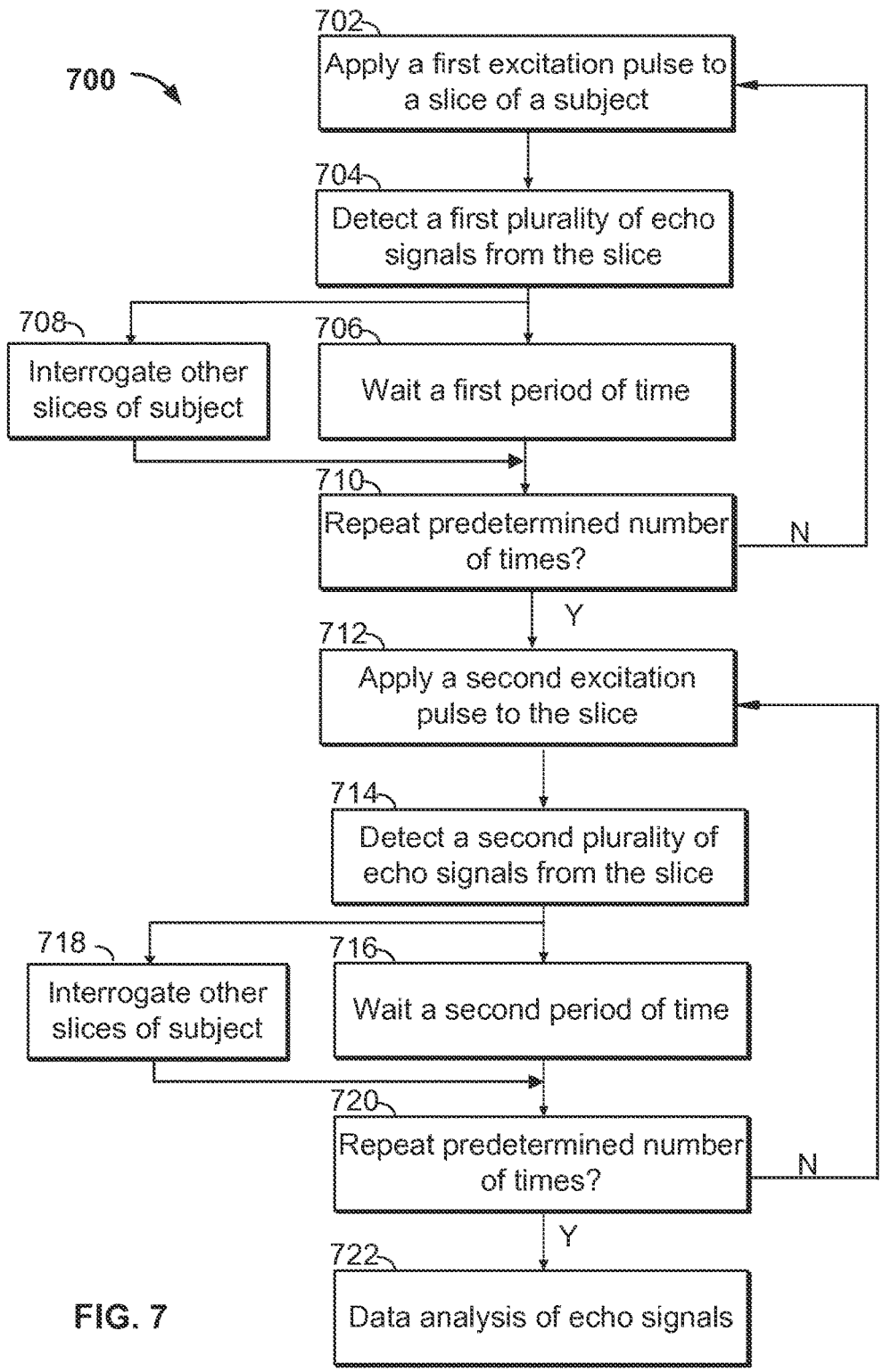
FIG. 7 shows a flow chart for a performing magnetic resonance pulse sequence in accordance with an implementation as described herein.

FIG. 7 shows a flow chart of an alternative method 700 of applying the pulse sequence illustrated in FIG. 5. Method 700 is performed on a slice of a subject placed inside a MRI machine, which exerts an external magnetic field and a gradient magnetic field on the subject. The segment of the subject's body to be scanned is divided into a number of slices, which may be consecutive cross-sectional portions. Method 700 begins by applying a first excitation pulse to a slice of a subject, shown at 702. The first excitation pulse is preferably 90-degree pulse but may take other configurations such as a 45-degree pulse or 60-degree pulse. The magnetization is originally maximally aligned with the external magnetic field and the first excitation pulse tilts the magnetization of the slice into the transverse plane. After the first excitation pulse is applied, a first plurality of echo signals is detected from the slice, shown at 704. Methods of generating and reading out echo signals may include, for example, a fast spin echo readout, a gradient and spin echo readout, or an echo planar readout. The number of echo spins generated is more than one and can be up to any predetermined number, such as three or four. At the end of the last echo signal readout, the longitudinal magnetization of the slice is zero.

Similar to the embodiments illustrated in FIGS. 2-5, after the echo signals are detected the MRI machine waits a first period of time, shown at 706. During this period of time, the longitudinal magnetization of the slice begins to recover from zero to its value before the first excitation pulse was applied, or in other words begins to positively align with the external magnetic field. The slice is only partially recovered when a second excitation pulse is applied, shown at 610. For example, the slice may be composed on several different tissue types, each of which has a different longitudinal magnetization recovery time. As discussed above, the duration of the first period of time and application of the second excitation pulse occurs when the spread between the longitudinal magnetizations of the tissues is at a maximum, or alternatively occurs at some other point during the partial recovery of the slice. During the first period of time, the MRI machine may inter-leave the scan, or interrogate other slices of the subject, shown at 708. For example, the MRI machine may apply the first excitation pulse and nearly simultaneously detect a plurality of echo signals from other slices. At the end of the first period of time, steps 702 through 706 are repeated to the slice of the subject for a predetermined number of times, illustrated as 710. For example, steps 702 through 706 may be repeated until a predetermined amount of magnetic resonance data has been acquired.

After steps 702 through 706 have been repeated a predetermined number of times, a second excitation pulse applied at 712 and is preferably 90 degree pulse but may take other configurations such as a 45 degree pulse or 60 degree pulse. The pulse again tilts the magnetization of the slice into the transverse plane. After the second excitation pulse is applied, a second plurality of echo signals is detected from the slice, shown at 714. The number of echo signals detected after the second excitation pulse may or may not be the same as the number of echo signals detected after the first excitation pulse. The readout methods used to detect the second plurality of echo signals may not be the same readout methods used to detect the first plurality of echo signals. At the end of the last echo signal readout, the longitudinal magnetization of the slice is zero. The MRI machine waits a second period of time, shown at 716. During this period of time, the slice fully recovers and is maximally aligned with the external magnetic field exerted by the MRI machine. Also during the second period of time the MRI scanner may interrogate other slices of the subject, shown at 718. At the end of the first period of time, steps 712 through 716 are repeated to the slice of the subject for a predetermined number of times, illustrated as 720. For example, steps 712 through 716 may be repeated until a predetermined amount of magnetic resonance data has been acquired. After the repetition of the pulse sequence is complete, data analysis on the readouts of the echo signals may then be performed, shown at 722. The pulse sequence illustrated in method 700 may be described as multi-spectral, meaning that multiple magnetic resonance image parameters may be obtained using the data acquired during the pulse sequence.

Figure 8:
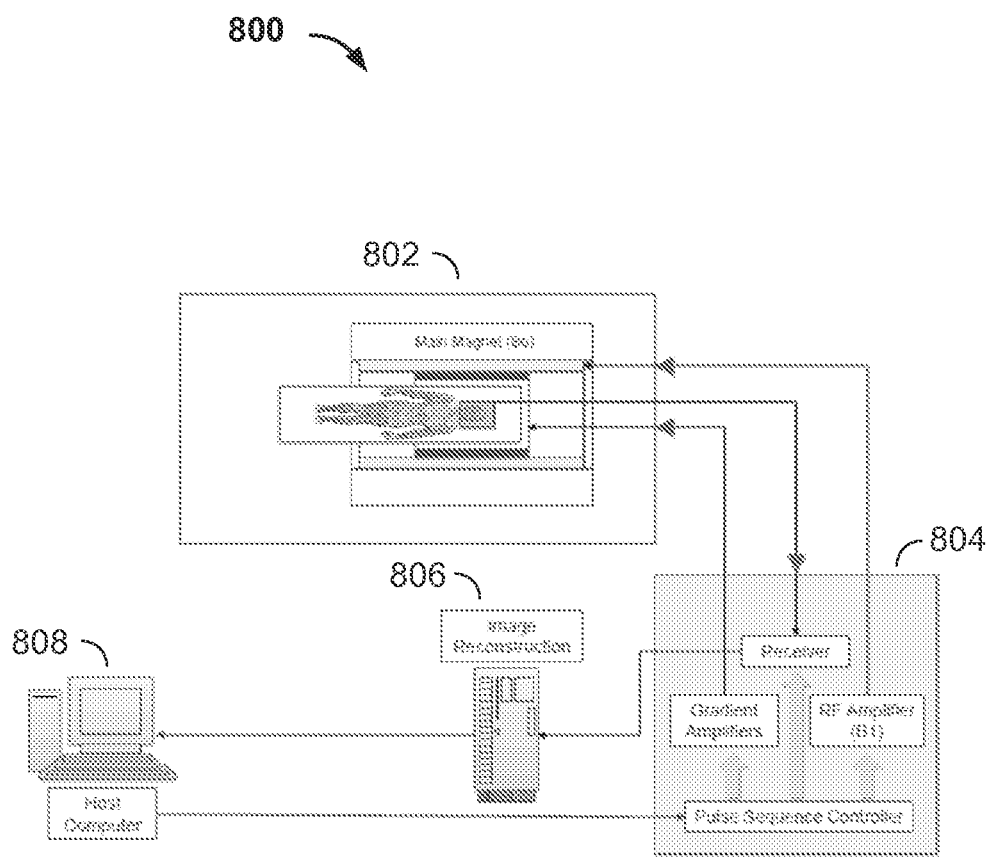
FIG. 8 schematically illustrates the basic components of an MRI system constructed and operating in accordance with an implementation as described herein.

The pulse sequences illustrated in FIGS. 2-5 are implemented on an MRI scanner. There are a number of commercially available MRI scanners available, all of which may be configured to perform this qMRI pulse sequence. FIG. 8 shows a basic block diagram of an MRI system. MRI system 800 usually has a MRI bore 802 in which a patient is positioned. A longitudinal magnetic field coil in the MRI bore generates an external magnetic field $B_0$ that is applied to the patient. For a horizontal bore scanner, the external magnetic field $B_0$ points along the longitudinal axis of MRI bore 802 and for an open magnet, $B_0$ points in the vertical direction. MRI bore 802 also has three sets of gradient magnetic field coils: the longitudinal (or z-axis) gradient coils, the x-axis gradient coils, and the y-axis gradient coils. Each gradient field coil may produce a gradient magnetic field along its axis. For example, activating the x-axis gradient coils may result in a linearly increasing magnetic field being applied across the x-axis of the patient's body such that the magnetic field on one side of the patient is greater than on the other side of the patient. The gradient field coils are used to isolate slices of the subject for nuclear magnetic resonance excitation.

MRI bore 802 also includes RF coils, which apply excitation pulses to the patient. For example, 90-degree excitation pulses or 180 degree refocusing pulses may be applied to the patient through the RF coil. MRI bore 802 also includes a readout coil for detecting magnetic excitations and emissions from the patient. For example, a slice of the patient emits a magnetic resonance excitation or echo signal, which induces an electrical current in the readout coil. Various readout methods may be performed using the readout coil, such as fast spin echo readout, gradient and echo spin echo readout, and echo planar readout. The longitudinal magnetic field coil, gradient coils, RF coil, and readout coil may all be controlled by controller 904. The controller includes one or more processors and control interfaces for controlling each component of MRI bore 802, such as a receiver for receiving readout data, gradient and RF amplifiers for controlling the gradient and RF coils, and a pulse sequence controller for applying pulse sequences to the patient. System 800 also includes an image reconstruction unit 806 for receiving MR data from controller 904 and constructing MR images from the data. System 800 also includes host computer 808 which receives the MR images generated by image reconstruction unit 906 and displays them to a user. Host computer 808 may also be used by a user to send control commands to controller 804, which in turn controls the operation of MRI bore 802. MRI system 800 may also be connected to a remote network, and other devices within the network may control MRI bore 802 or obtain data collected by controller 804. In this manner, MRI system 800 may apply the pulse sequences illustrated in FIGS. 2-5 to a patient.

EXEMPLARY EMBODIMENTS

The following exemplary embodiments are provided for illustrative purposes only and do not limit the scope of the invention or this disclosure.

Embodiment 1

A method of performing a multi-slice magnetic resonance scan on a subject, the method comprising: (a) applying a first excitation pulse to a first slice of a subject; (b) detecting a first plurality of echo signals emitted by the first slice after the first excitation pulse; (c) waiting a first period of time; (d) applying a second excitation pulse to the first slice during partial recovery of a longitudinal magnetization of the first slice; and (e) detecting a second plurality of echo signals emitted by the first slice after the second excitation pulse.

Embodiment 2

The method of embodiment 1, wherein detecting the first plurality of echo signals comprises obtaining an electrical response from each echo signal in the first plurality of echo signals.

Embodiment 3

The method of any one of embodiments 1 and 2, wherein the detected first plurality of echo signals are spin echoes, gradient echoes, or a combination of spin echoes and gradient echoes.

Embodiment 4

The method of any one of embodiments 1-3, wherein a first echo signal in the first plurality of echo signals and a first echo signal in the second plurality of echo signals are combined to form a plurality of fast spin echo readouts, a plurality of turbo spin echo readouts, or a plurality of gradient and spin echo readouts.

Embodiment 5

The method of any one of embodiments 1-4, wherein steps (a)-(c) are applied to one or more additional slices of the subject during the first waiting period of time.

Embodiment 6

The method of any one of embodiments 1-5, the method further comprising: (f) waiting a second period of time; and (g) repeating steps (a)-(f) a predetermined number of times.

Embodiment 7

The method of embodiment 6, wherein steps (d)-(f) are applied to one or more additional slices of the subject during the second period of time.

Embodiment 8

The method of any one of embodiments 1-7, the method further comprising: (h) storing data indicative of a plurality of parameters of the first slice from the detected first plurality of echo signals and the second plurality of echo signals over the predetermined number of times.

Embodiment 9

The method of embodiment 8, wherein the data are stored in computer memory.

Embodiment 10

The method of any one of embodiments 8 and 9, wherein the Fourier transform is applied to the data to form a plurality of differently weighted magnetic resonance images for the first slice.

Embodiment 11

The method of any one of embodiments 8-10, wherein a plurality of magnetic resonance images are constructed from the data.

Embodiment 12

The method of any one of embodiments 1-11, wherein the first excitation pulse is applied when the longitudinal magnetization of the first slice is equal to a net magnetization $M_0$.

Embodiment 13

A method of performing a magnetic resonance scan on a subject, the method comprising: (a) applying a first excitation pulse to a first slice of the subject; (b) detecting a first set of at least three echo signals emitted by the first slice after the first excitation pulse; (c) waiting a first period of time; (d) repeating steps (a) through (c) a first predetermined number of times; (e) applying a second excitation pulse to the first slice; (f) detecting a second set of at least three echo signals emitted by the first slice after the second excitation pulse; (g) waiting a second period of time; and (h) repeating steps (e) through (g) a second predetermined number of times.

Embodiment 14

The method of embodiment 13, wherein detecting the first plurality of echo signals comprises obtaining an electrical response from each echo signal in the first plurality of echo signals.

Embodiment 15

The method of any one of embodiments 13 and 14, wherein the detected first plurality of echo signals are spin echoes, gradient echoes, or a combination of spin echoes and gradient echoes.

Embodiment 16

The method of any one of embodiments 13-15, wherein a first echo signal in the first plurality of echo signals and a first echo signal in the second plurality of echo signals are combined to form a plurality of fast spin echo readouts, a plurality of turbo spin echo readouts, or a plurality of gradient and spin echo readouts.

Embodiment 17

The method of any one of embodiments 13-16, wherein steps (a)-(c) are applied to one or more additional slices of the subject during the first period of time.

Embodiment 18

The method of any one of embodiments 13-17, wherein steps (e)-(g) are applied to one or more additional slices of the subject during the second period of time.

Embodiment 19

The method of any one of embodiments 13-18, the method further comprising: (i) storing data indicative of a plurality of parameters of the first slice from the detected first plurality of echo signals over the first predetermined number of times and the second plurality of echo signals over the second predetermined number of times.

Embodiment 20

The method of embodiment 19, wherein the data are stored in computer memory.

Embodiment 21

The method of any one of embodiments 19 and 20, wherein the Fourier transform is applied to the data to form a plurality of differently weighted magnetic resonance images for the first slice.

Embodiment 22

The method of any one of embodiments 19-21, wherein a plurality of magnetic resonance images are constructed from the data.

Embodiment 23

The method of any one of embodiments 13-22, wherein the first excitation pulse is applied when the longitudinal magnetization of the first slice is equal to a net magnetization $M_0$.

Embodiment 24

A system configured for performing magnetic resonance imaging, comprising: a magnetic resonance imaging machine configured to apply an external magnetic field and a plurality of excitation pulses to a subject in the magnetic resonance imaging machine; and a control system connected to the magnetic resonance imaging machine and configured to perform a method comprising: (a) applying a first excitation pulse to a first slice of a subject; (b) detecting a first plurality of echo signals emitted by the first slice after the first excitation pulse; (c) waiting a first period of time; (d) applying a second excitation pulse to the first slice during partial recovery of a longitudinal magnetization of the first slice; and (e) detecting a second plurality of echo signals emitted by the first slice after the second excitation pulse.

Embodiment 25

The system of embodiment 24, wherein detecting the first plurality of echo signals comprises obtaining an electrical response from each echo signal in the first plurality of echo signals.

Embodiment 26

The system of any one of embodiments 24 and 254, wherein the detected first plurality of echo signals are spin echoes, gradient echoes, or a combination of spin echoes and gradient echoes.

Embodiment 27

The system of any one of embodiments 24-26, wherein a first echo signal in the first plurality of echo signals and a first echo signal in the second plurality of echo signals are combined to form a plurality of fast spin echo readouts, a plurality of turbo spin echo readouts, or a plurality of gradient and spin echo readouts.

Embodiment 28

The system of any one of embodiments 24-27, wherein steps (a)-(c) are applied to one or more additional slices of the subject during the first period of time.

Embodiment 29

The system of any one of embodiments 24-28, the method further comprising: (f) waiting a second period of time; and (g) repeating steps (a)-(f) a predetermined number of times.

Embodiment 30

The system of embodiment 29, wherein steps (d)-(f) are applied to one or more additional slices of the subject during the second period of time.

Embodiment 31

The system of any one of embodiments 24-30, the method further comprising: (h) storing data indicative of a plurality of parameters of the first slice from the detected first plurality of echo signals and the second plurality of echo signals over the predetermined number of times.

Embodiment 32

The system of embodiment 31, wherein the data are stored in computer memory.

Embodiment 33

The system of any one of embodiments 31 and 32, wherein the Fourier transform is applied to the data to form a plurality of differently weighted magnetic resonance images for the first slice.

Embodiment 34

The system of any one of embodiments 31-33, wherein a plurality of magnetic resonance images are constructed from the data.

Embodiment 35

The system of any one of embodiments 24-34, wherein the first excitation pulse is applied when the longitudinal magnetization of the first slice is equal to a net magnetization $M_0$.

Embodiment 36

A system configured for performing magnetic resonance imaging, comprising: a magnetic resonance imaging machine configured to apply an external magnetic field and a plurality of excitation pulses to a subject in the magnetic resonance imaging machine; and a control system connected to the magnetic resonance imaging machine and configured to perform a method comprising: (a) applying a first excitation pulse to a first slice of the subject; (b) detecting a first set of at least three echo signals emitted by the first slice after the first excitation pulse; (c) waiting a first period of time; (d) repeating steps (a) through (c) a first predetermined number of times; (e) applying a second excitation pulse to the first slice; (f) detecting a second set of at least three echo signals emitted by the first slice after the second excitation pulse; (g) waiting a second period of time; and (h) repeating steps (e) through (g) a second predetermined number of times.

Embodiment 37

The system of embodiment 36, wherein detecting the first plurality of echo signals comprises obtaining an electrical response from each echo signal in the first plurality of echo signals.

Embodiment 38

The system of any one of embodiments 36 and 37, wherein the detected first plurality of echo signals are spin echoes, gradient echoes, or a combination of spin echoes and gradient echoes.

Embodiment 39

The system of any one of embodiments 36-38, wherein a first echo signal in the first plurality of echo signals and a first echo signal in the second plurality of echo signals are combined to form a plurality of fast spin echo readouts, a plurality of turbo spin echo readouts, or a plurality of gradient and spin echo readouts.

Embodiment 40

The system of any one of embodiments 36-39, wherein steps (a)-(c) are applied to one or more additional slices of the subject during the first period of time.

Embodiment 41

The system of any one of embodiments 36-40, wherein steps (e)-(g) are applied to one or more additional slices of the subject during the second period of time.

Embodiment 42

The system of any one of embodiments 36-41, the method further comprising: (i) storing data indicative of a plurality of parameters of the first slice from the detected first plurality of echo signals over the first predetermined number of times and the second plurality of echo signals over the second predetermined number of times.

Embodiment 43

The system of embodiment 42, wherein the data are stored in computer memory.

Embodiment 44

The system of any one of embodiments 42 and 43, wherein the Fourier transform is applied to the data to form a plurality of differently weighted magnetic resonance images for the first slice.

Embodiment 45

The system of any one of embodiments 42-44, wherein a plurality of magnetic resonance images are constructed from the data.

Embodiment 46

The system of any one of embodiments 36-45, wherein the first excitation pulse is applied when the longitudinal magnetization of the first slice is equal to a net magnetization $M_0$.

Embodiment 47

A method of performing a multi-slice magnetic resonance scan on a subject, the method comprising: (a) applying a first excitation pulse to a first interrogated slice of a subject; (b) detecting a first plurality of echo signals emitted by the first interrogated slice after the first excitation pulse; (c) waiting a first period of time sufficient for partial recovery of the first interrogated slice; (d) applying (a)-(c) to one or more additional interrogated slices during the first period of time; (e) applying a second excitation pulse to the first interrogated slice during partial recovery of a longitudinal magnetization of the first interrogated slice; (f) detecting a second plurality of echo signals emitted by the first interrogated slice after the second excitation pulse; (g) applying (e)-(f) to one or more of the additional interrogated slices during the second period of time; and (h) repeating (a)-(g) with a single repetition time TR.

Embodiment 48

A method of performing a multi-slice magnetic resonance scan on a subject, the method comprising: (a) applying a first excitation pulse to a first interrogated slice of a subject; (b) detecting a first plurality of echo signals emitted by the first interrogated slice after the first excitation pulse; (c) applying (a) and (b) to one or more additional interrogated slices with a repetition time TR1; (d) applying a second excitation pulse to the first slice of a subject; (e) detecting a second plurality of echo signals emitted by the first interrogated slice after the second excitation pulse; and (f) applying (d) and (e) to one or more additional interrogated slices with a repetition time TR2.

Embodiment 49

A system configured for performing magnetic resonance imaging, comprising: a magnetic resonance imaging machine configured to apply an external magnetic field and a plurality of excitation pulses to a subject in the magnetic resonance imaging machine; and a control system connected to the magnetic resonance imaging machine and configured to perform a method comprising: (a) applying a first excitation pulse to a first interrogated slice of a subject; (b) detecting a first plurality of echo signals emitted by the first interrogated slice after the first excitation pulse; (c) waiting a first period of time sufficient for partial recovery of the first interrogated slice; (d) applying (a)-(c) to one or more additional interrogated slices during the first period of time; (e) applying a second excitation pulse to the first interrogated slice during partial recovery of a longitudinal magnetization of the first interrogated slice; (f) detecting a second plurality of echo signals emitted by the first interrogated slice after the second excitation pulse; (g) applying (e)-(f) to one or more of the additional interrogated slices during the second period of time; and (h) repeating (a)-(g) with a single repetition time TR.

Embodiment 50

A system configured for performing magnetic resonance imaging, comprising: a magnetic resonance imaging machine configured to apply an external magnetic field and a plurality of excitation pulses to a subject in the magnetic resonance imaging machine; and a control system connected to the magnetic resonance imaging machine and configured to perform a method comprising: (a) applying a first excitation pulse to a first interrogated slice of a subject; (b) detecting a first plurality of echo signals emitted by the first interrogated slice after the first excitation pulse; (c) applying (a) and (b) to one or more additional interrogated slices with a repetition time TR1; (d) applying a second excitation pulse to the first slice of a subject; (e) detecting a second plurality of echo signals emitted by the first interrogated slice after the second excitation pulse; and (f) applying (d) and (e) to one or more additional interrogated slices with a repetition time TR2.

Embodiment 51

A means for performing magnetic resonance scans on a subject, the means comprising: means for applying a first excitation pulse to a slice of a subject; means for applying a second excitation pulse to the slice during partial recovery of a longitudinal magnetization of the slice; and means for detecting a plurality of echo signals emitted by the slice after each of the first excitation pulse and the second excitation pulse.

It is to be understood that while various illustrative implementations have been described, the forgoing description is merely illustrative and does not limit the scope of the invention. While several examples have been provided in the present disclosure, it should be understood that the disclosed systems, components and methods of manufacture may be embodied in many other specific forms without departing from the scope of the present disclosure.

The examples disclosed can be implemented in combinations or sub-combinations with one or more other features described herein. A variety of apparatus, systems and methods may be implemented based on the disclosure and still fall within the scope of the invention. Also, the various features described or illustrated above may be combined or integrated in other systems or certain features may be omitted, or not implemented.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure.

I claim:

1. A method of performing a multi-slice magnetic resonance scan on a subject, the method comprising:
   (a) applying a first excitation pulse to a first slice of a subject;
   (b) detecting a first plurality of echo signals emitted by the first slice after the first excitation pulse;
   (c) waiting a first period of time;
   (d) applying a second excitation pulse to the first slice during partial recovery of a longitudinal magnetization of the first slice; and
   (e) detecting a second plurality of echo signals emitted by the first slice after the second excitation pulse.

2. The method of claim 1, wherein detecting the first plurality of echo signals comprises obtaining an electrical response from each echo signal in the first plurality of echo signals.

3. The method of claim 1, wherein the detected first plurality of echo signals are spin echoes, gradient echoes, or a combination of spin echoes and gradient echoes.

4. The method of claim 1, wherein a first echo signal in the first plurality of echo signals and a first echo signal in the second plurality of echo signals are combined to form a plurality of fast spin echo readouts, a plurality of turbo spin echo readouts, or a plurality of gradient and spin echo readouts.

5. The method of claim 1, wherein steps (a)-(c) are applied to one or more additional slices of the subject during the first period of time.

6. The method of claim 1, the method further comprising:
   (f) waiting a second period of time; and
   (g) repeating steps (a)-(f) a predetermined number of times.

7. The method of claim 6, wherein steps (d)-(f) are applied to one or more additional slices of the subject during the second period of time.

8. The method of claim 1, wherein the first excitation pulse is applied when the longitudinal magnetization of the first slice is equal to a net magnetization $M_0$.

9. A method of performing a magnetic resonance scan on a subject, the method comprising:
   (a) applying a first excitation pulse to a first slice of the subject;
   (b) detecting a first set of at least three echo signals emitted by the first slice after the first excitation pulse;
   (c) waiting a first period of time;
   (d) repeating steps (a) through (c) a first predetermined number of times;
   (e) applying a second excitation pulse to the first slice;
   (f) detecting a second set of at least three echo signals emitted by the first slice after the second excitation pulse;
   (g) waiting a second period of time; and
   (h) repeating steps (e) through (g) a second predetermined number of times.

10. The method of claim 9, wherein detecting the first plurality of echo signals comprises obtaining an electrical response from each echo signal in the first plurality of echo signals.

11. The method of claim 9, wherein the detected first plurality of echo signals are spin echoes, gradient echoes, or a combination of spin echoes and gradient echoes.

12. The method of claim 9, wherein a first echo signal in the first plurality of echo signals and a first echo signal in the second plurality of echo signals are combined to form a plurality of fast spin echo readouts, a plurality of turbo spin echo readouts, or a plurality of gradient and spin echo readouts.

13. The method of claim 9, wherein steps (a)-(c) are applied to one or more additional slices of the subject during the first period of time.

14. The method of claim 9, wherein steps (e)-(g) are applied to one or more additional slices of the subject during the second period of time.

15. The method of claim 9, wherein the first excitation pulse is applied when the longitudinal magnetization of the first slice is equal to a net magnetization $M_0$.

16. A system configured for performing magnetic resonance imaging, comprising:
   a magnetic resonance imaging machine configured to apply an external magnetic field and a plurality of excitation pulses to a subject in the magnetic resonance imaging machine; and
   a control system connected to the magnetic resonance imaging machine and configured to perform a method comprising:
   (a) applying a first excitation pulse to a first slice of a subject;
   (b) detecting a first plurality of echo signals emitted by the first slice after the first excitation pulse;
   (c) waiting a first period of time;
   (d) applying a second excitation pulse to the first slice during partial recovery of a longitudinal magnetization of the first slice; and
   (e) detecting a second plurality of echo signals emitted by the first slice after the second excitation pulse.

17. The system of claim 16, wherein a first echo signal in the first plurality of echo signals and a first echo signal in the second plurality of echo signals are combined to form a plurality of fast spin echo readouts, a plurality of turbo spin echo readouts, or a plurality of gradient and spin echo readouts.

18. The system of claim 16, the method further comprising:
   (f) waiting a second period of time; and
   (g) repeating steps (a)-(f) a predetermined number of times.

19. The system of claim 18, wherein steps (d)-(f) are applied to one or more additional slices of the subject during the second period of time.

20. A system configured for performing magnetic resonance imaging, comprising:
   a magnetic resonance imaging machine configured to apply an external magnetic field and a plurality of excitation pulses to a subject in the magnetic resonance imaging machine; and
   a control system connected to the magnetic resonance imaging machine and configured to perform a method comprising:
   (a) applying a first excitation pulse to a first slice of the subject;

(b) detecting a first set of at least three echo signals emitted by the first slice after the first excitation pulse;
(c) waiting a first period of time;
(d) repeating steps (a) through (c) a first predetermined number of times;
(e) applying a second excitation pulse to the first slice;
(f) detecting a second set of at least three echo signals emitted by the first slice after the second excitation pulse;
(g) waiting a second period of time; and
(h) repeating steps (e) through (g) a second predetermined number of times.

\* \* \* \* \*